(12) United States Patent
Lakkis

(10) Patent No.: US 7,583,139 B2
(45) Date of Patent: Sep. 1, 2009

(54) POWER-EFFICIENT AUTOMATIC GAIN CONTROL

(75) Inventor: Ismail Lakkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 6 days.

(21) Appl. No.: 11/634,659

(22) Filed: Dec. 6, 2006

(65) Prior Publication Data

US 2008/0136513 A1   Jun. 12, 2008

(51) Int. Cl.
*H03F 1/14* (2006.01)
(52) U.S. Cl. ..................... 330/51; 330/124 D
(58) Field of Classification Search .............. 330/51, 330/124 R, 124 D, 278, 295
See application file for complete search history.

(56) References Cited

U.S. PATENT DOCUMENTS

| | | | | |
|---|---|---|---|---|
| 4,490,687 A * | 12/1984 | Schroder | ..................... | 330/279 |
| 5,008,631 A * | 4/1991 | Scherer et al. | ................. | 330/51 |
| 6,069,526 A * | 5/2000 | Ballantyne | ................... | 330/51 |
| 7,215,192 B2 * | 5/2007 | Kim et al. | ..................... | 330/51 |

* cited by examiner

*Primary Examiner*—Henry K Choe
(74) *Attorney, Agent, or Firm*—Dang M. Vo

(57) ABSTRACT

A multi-stage amplifier configured for processing a received baseband signal comprises a plurality of fixed-gain amplifier stages and an automatic gain control (AGC) module. Each amplifier stage further comprises a switch and a bypass circuit. The AGC module is configured for controlling the switch for bypassing at least one of the amplifier stages. The multi-stage amplifier may be configured to perform fine gain adjustment and coarse gain adjustment, wherein fine gain adjustment may comprise adjusting a load-resistor value in at least one amplifier and coarse gain adjustment may comprise bypassing one or more fixed-gain amplifier stages.

10 Claims, 2 Drawing Sheets

POWER-EFFICIENT AUTOMATIC GAIN CONTROL

BACKGROUND

1. Field of the Invention

The invention relates generally to an apparatus and method for amplifying baseband signals, and more specifically, to a power efficient method of providing for automatic gain control.

2. Discussion of the Related Art

A radio receiver in a wireless communication system is coupled to an antenna and includes a low-noise amplifier, programmable-gain amplifier, one or more intermediate frequency stages, a filtering stage, automatic gain control (AGC), and a baseband-processing stage. The low-noise amplifier receives transmitted RF signals via the antenna and amplifies them. The programmable-gain amplifier may further amplify the RF signals. The one or more intermediate frequency stages mix the amplified RF signals with one or more local reference signals to convert the amplified RF signal into baseband or intermediate frequency (IF) signals. The filtering stage filters the baseband or IF signals to attenuate unwanted out-of-band signals to produce filtered signals. The baseband-processing stage recovers raw data from the filtered signals in accordance with the particular wireless communication standard employed.

The signal strength of a received RF signal may vary substantially (e.g., by 100 dB). Thus, the AGC adjusts the gain of the low-noise amplifier, the programmable-gain amplifier, and/or digital gain within the baseband-processing stage such that the receiver is sensitive enough to detect received low-power signals and, once detected, to adjust the gain of these components to achieve nominal signal level. The AGC may also be configured to decrease the gain of the low-noise amplifier, the programmable-gain amplifier, and/or the digital gain of the baseband-processing stage when the received signal is a strong signal. Gain control typically comprises varying the load of an amplification circuit, thus dissipating power.

SUMMARY OF THE INVENTION

Embodiments of the invention are configured for performing automatic gain control for converting an IF and/or a baseband signal having a highly variable power to a signal having power within a predetermined range. A multi-stage amplification means comprises a plurality of fixed-gain amplifier stages and a switching means coupled to an AGC means. The AGC means is configured for controlling the switching means for bypassing at least one of the plurality of fixed-gain amplifier stages. Bypassing an amplifier stage reduces power dissipation. In one embodiment, the multi-stage amplification means comprises a fine gain adjustment means and a coarse gain adjustment means. The fine gain adjustment means may be configured for performing variable gain adjustment by adjusting a load-resistor value in at least one amplifier.

In one embodiment of the invention, a system configured for performing automatic gain control, comprises a multi-stage amplification means configured for amplifying a received baseband signal in a plurality of stages, and an AGC means configured for bypassing at least one of the plurality of stages in the multi-stage amplification means.

The multi-stage amplification means may include, by way of example, but without limitation, a sequence of amplifiers including a bypass switch arrangement. The sequence of amplifiers may comprise a plurality of baseband amplifiers, or a combination of at least one baseband amplifier, at least one IF amplifier, and at least one RF amplifier. The multi-stage amplification means may include a variable-gain amplifier for performing fine gain adjustment. The AGC means may include, by way of example, but without limitation, any apparatus or algorithm configured for operating the bypass switch arrangement to provide for gain control of a signal input to the multi-stage amplification means.

Although particular embodiments are described herein, many variations and permutations of these embodiments fall within the scope and spirit of the invention. Although some benefits and advantages of the preferred embodiments are mentioned, the scope of the invention is not intended to be limited to particular benefits, uses, or objectives. Rather, embodiments of the invention are intended to be broadly applicable to different wireless technologies, system configurations, networks, and transmission protocols, some of which are illustrated by way of example in the figures and in the following description of the preferred embodiments. The detailed description and drawings are merely illustrative of the invention rather than limiting, the scope of the invention being defined by the appended claims and equivalents thereof.

BRIEF DESCRIPTION OF THE DRAWINGS

Embodiments according to the present invention are understood with reference to the following figures.

DESCRIPTION OF THE PREFERRED EMBODIMENTS

Figure 1A:
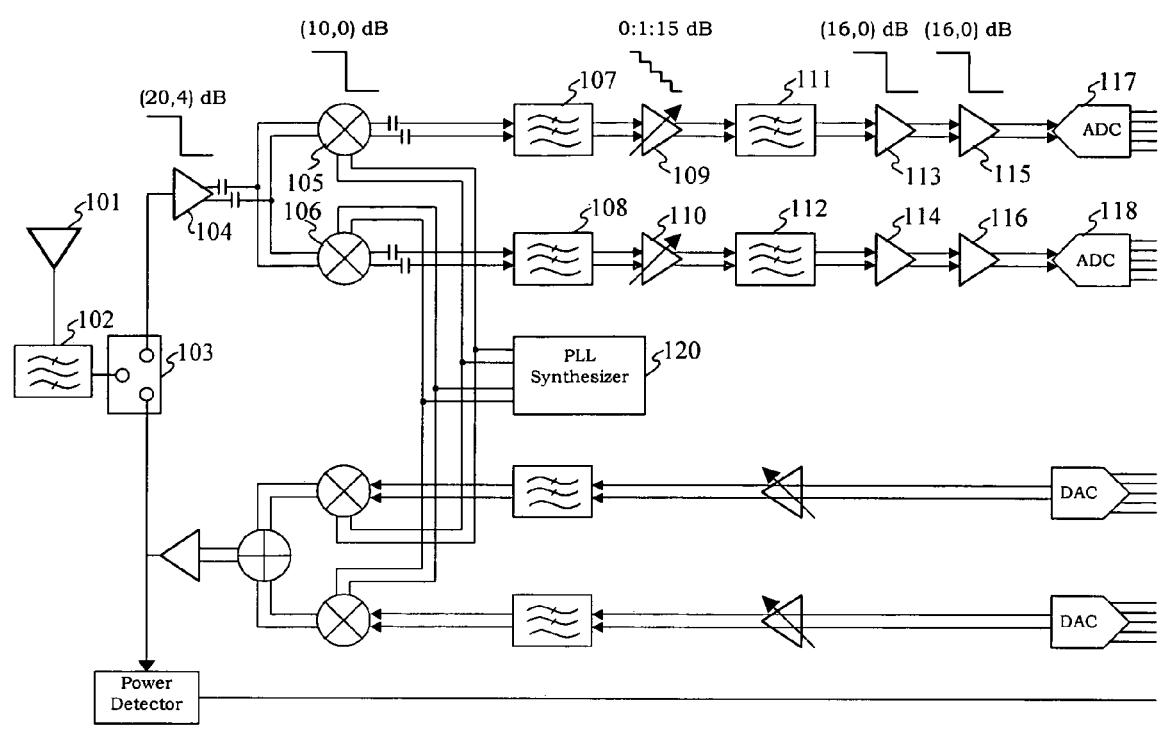
FIG. 1A illustrates a receiver in accordance with one embodiment of the invention.

While the invention is susceptible to various modifications and alternative forms, specific embodiments thereof are shown by way of example in the drawings and are herein described in detail. It should be understood, however, that the exemplary embodiments are not intended to limit the invention to the particular forms disclosed. Instead, the invention is to cover all modifications, equivalents, and alternatives falling within the spirit and scope of the invention as defined by the claims.

In accordance with one embodiment of the invention, FIG. 1A shows a transceiver comprising a plurality of amplifier stages in a receiver branch. The transceiver includes at least one antenna 101 and associated RF-processing circuitry 102, and a duplexer 103. The receiver branch includes an RF amplifier 104, In-phase (I) and Quadrature-phase (Q) mixers 105 and 106, baseband or intermediate-frequency processing circuits 107 and 108, variable fine gain adjustment amplifiers 109 and 110, optional baseband processing circuits 111 and 112, and a multi-stage amplifier, such as amplifier stages 113 and 115 and amplifier stages 114 and 116. Each amplifier stage 113-116 includes a bypass switch arrangement that allows an amplifier to be controllably used as a fixed-gain stage operable to switch a fixed amount (e.g., in one embodiment 16 dB) of gain into the receive path. More specifically, the switch arrangement, when operated, foregoes that amount of gain for the received signal.

Figure 1B:
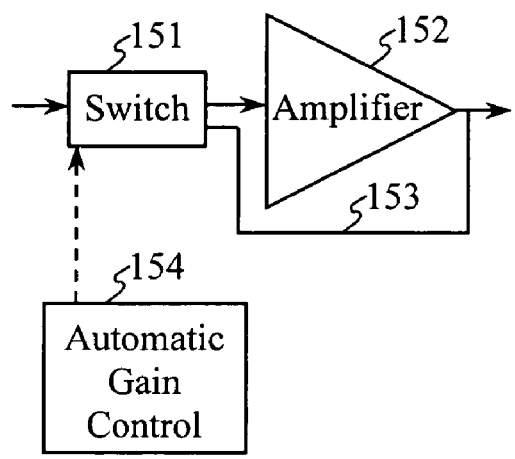
FIG. 1B illustrates an amplifier stage in accordance with an embodiment of the invention.

In one embodiment, the amplifier stages 113 and 115 (as well as stages 114 and 116) are configured for providing coarse gain adjustment. FIG. 1B illustrates an amplifier stage comprising a switch 151, an amplifier 152, and a bypass circuit 153. An Automatic Gain Control (AGC) module 154 controls the switch 151 to couple an input signal into the amplifier 152, which is set to a constant gain (e.g., 16 dB), or to couple the input signal into the bypass circuit 153, which bypasses the amplifier 152. The AGC module 154 may be configured to control one or more amplifier stages.

A multi-stage amplifier in accordance with one embodiment of the invention may further include at least one variable-gain amplifier (such as amplifiers 109 and 110) configured for performing fine gain adjustment. In this case, the AGC module 154 is configured to adjust a load-resistor value in the at least one variable-gain amplifier 109 and 110.

Figure 2:
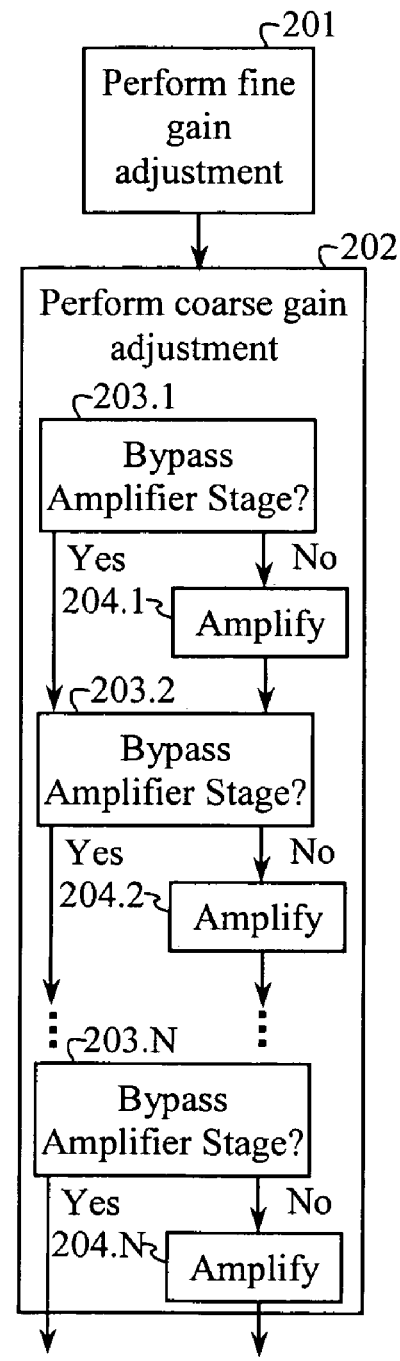
FIG. 2 illustrates an automatic gain control method according to another embodiment of the invention.

FIG. 2 shows a method for performing automatic gain control on a received baseband signal in accordance with an embodiment of the invention. Fine gain adjustment, which may comprise conventional variable gain adjustment, is performed 201 on the baseband signal prior to performing coarse gain adjustment 202.

Coarse gain adjustment 202 comprises performing automatic gain control to bypass at least one of a plurality N of amplification stages. For example, a decision 203.1 may be made to bypass an amplifier stage that provides a constant gain to an input signal. Otherwise the input signal is amplified 204.1. Such decisions 203.1-203.N may be made for each amplifier stage as a means for providing coarse gain adjustment to the received baseband signal.

It should be appreciated that those skilled in the art will be able to devise various arrangements, which, although not explicitly described or shown herein, embody the principles of the invention and are included within its spirit and scope. Furthermore, all examples and conditional language recited herein are intended to be only for pedagogical purposes to aid the reader in understanding the principles of the invention. This disclosure and its associated references are to be construed as being without limitation to such specifically recited examples and conditions. Moreover, all statements herein reciting principles, aspects, and embodiments of the invention, as well as specific examples thereof, are intended to encompass both structural and functional equivalents thereof.

It should be appreciated by those skilled in the art that the block diagrams herein represent conceptual views of illustrative circuitry, algorithms, and functional steps embodying principles of the invention.

The functions of the various elements shown in the drawings, may be provided through the use of dedicated hardware as well as hardware capable of executing software in association with appropriate software. The functions may be provided by a single dedicated processor, by a shared processor, or by a plurality of individual processors, some of which may be shared. A processor may include, without limitation, digital signal processor (DSP) hardware, read-only memory (ROM) for storing software, random access memory (RAM), and non-volatile storage. Other hardware, conventional and/or custom, may also be included. Similarly, the function of any component or device described herein may be carried out through the operation of program logic, through dedicated logic, or through the interaction of program control and dedicated logic, the particular technique being selectable by the implementer as more specifically understood from the context.

Any element expressed herein as a means for performing a specified function is intended to encompass any way of performing that function including, for example, a combination of circuit elements which performs that function or software in any form, including, firmware, micro-code or the like, combined with appropriate circuitry for executing that software to perform the function. Embodiments of the invention as described herein reside in the fact that the functionalities provided by the various recited means are combined and brought together in the manner which the operational descriptions call for. Applicant regards any means which can provide those functionalities as equivalent as those shown herein.

The invention claimed is:

1. An apparatus, comprising:
a plurality of amplifier stages, each amplifier stage comprising an amplifier, a bypass circuit, and a switch, the switch configured to couple an input signal into one of the amplifier and the bypass circuit,
an automatic gain control (AGC) module configured for controlling at least one switch for selecting at least one amplifier to bypass, wherein the AGC module is further configured to adjust a load-resistor value in at least one of the plurality of amplifier stages for performing fine gain adjustment.

2. The apparatus recited in claim 1, further configured to perform fine gain adjustment and coarse gain adjustment.

3. The apparatus recited in claim 1 integrated in a chipset.

4. A method for performing automatic gain control, comprising:
providing for a plurality of amplification stages,
performing automatic gain control (AGC) to bypass at least one of the plurality of amplification stages, and
adjusting a load-resistor value in at least one of the plurality of amplification stages for performing fine gain adjustment.

5. The method recited in claim 4, further comprising:
performing fine gain adjustment and coarse gain adjustment.

6. A chipset configured to perform the method recited in claim 4.

7. A digital computer system programmed to perform the method recited in claim 4.

8. A computer-readable medium storing a computer program implementing the method of claim 4.

9. An apparatus configured for performing automatic gain control, comprising:
a multi-stage amplification means configured for amplifying a received baseband signal in a plurality of stages, and
an automatic gain control (AGC) means configured for bypassing at least one of the plurality of stages in the multi-stage amplification means, wherein the AGC means is further configured to adjust a load-resistor value in at least one amplifier in the multi-stage amplification means for performing fine grain adjustment.

10. The apparatus recited in claim 9, wherein the multi-stage amplification means comprises a fine gain adjustment means and a coarse gain adjustment means.

* * * * *